(12) United States Patent
Sakurada

(10) Patent No.: US 10,355,092 B2
(45) Date of Patent: Jul. 16, 2019

(54) SILICON EPITAXIAL WAFER AND METHOD OF PRODUCING SILICON EPITAXIAL WAFER

(71) Applicant: SHIN-ETSU HANDOTAI CO., LTD., Tokyo (JP)

(72) Inventor: Masahiro Sakurada, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 735 days.

(21) Appl. No.: 14/785,720

(22) PCT Filed: Mar. 28, 2014

(86) PCT No.: PCT/JP2014/001819
§ 371 (c)(1),
(2) Date: Oct. 20, 2015

(87) PCT Pub. No.: WO2014/181496
PCT Pub. Date: Nov. 13, 2014

(65) Prior Publication Data
US 2016/0126318 A1 May 5, 2016

(30) Foreign Application Priority Data
May 10, 2013 (JP) .................................. 2013-100180

(51) Int. Cl.
*H01L 27/146* (2006.01)
*H01L 31/06* (2012.01)
(Continued)

(52) U.S. Cl.
CPC ............ *H01L 29/167* (2013.01); *C30B 15/00* (2013.01); *C30B 25/02* (2013.01); *C30B 25/20* (2013.01);
(Continued)

(58) Field of Classification Search
CPC ............... H01L 29/167; H01L 21/3225; H01L 21/02573; H01L 21/02381;
(Continued)

(56) References Cited

U.S. PATENT DOCUMENTS

2001/0042875 A1  11/2001  Yoshida
2007/0178668 A1   8/2007  Nakai et al.
(Continued)

FOREIGN PATENT DOCUMENTS

CN    101024895 A    8/2007
CN    101351890 A    1/2009
(Continued)

OTHER PUBLICATIONS

Jan. 3, 2017 Office Action issued in Chinese Patent Application No. 201480024949.3.
(Continued)

*Primary Examiner* — Jonathan C Langman
(74) *Attorney, Agent, or Firm* — Oliff PLC

(57) ABSTRACT

A silicon epitaxial wafer including: a second intermediate epitaxial layer on a silicon substrate produced by being cut from a silicon single crystal ingot grown by the CZ method so as to have a carbon concentration ranging from $3\times10^{16}$ to $2\times10^{17}$ atoms/cm$^3$, a first intermediate epitaxial layer doped with a dopant, and an epitaxial layer of a device forming region stacked on the first intermediate epitaxial layer, and to a method of producing this wafer. Also providing an industrially excellent silicon epitaxial wafer that is produced with a silicon substrate doped with carbon and used as a semiconductor device substrate such as a memory, a logic, or a solid-state image sensor, and a method of producing this silicon epitaxial wafer.

6 Claims, 8 Drawing Sheets

(51) Int. Cl.
  *H01L 31/068* (2012.01)
  *H01L 29/167* (2006.01)
  *H01L 21/02* (2006.01)
  *C30B 29/06* (2006.01)
  *C30B 15/00* (2006.01)
  *C30B 25/02* (2006.01)
  *H01L 21/322* (2006.01)
  *C30B 25/20* (2006.01)
  *C30B 29/68* (2006.01)
  *C30B 31/02* (2006.01)

(52) U.S. Cl.
  CPC .............. *C30B 29/06* (2013.01); *C30B 29/68* (2013.01); *C30B 31/02* (2013.01); *H01L 21/02576* (2013.01); *H01L 21/02579* (2013.01); *H01L 21/3225* (2013.01); *H01L 21/02381* (2013.01); *H01L 21/02532* (2013.01); *H01L 21/02573* (2013.01)

(58) Field of Classification Search
  CPC ......... H01L 21/02532; H01L 21/02576; H01L 21/02579; C30B 29/68; C30B 25/20; C30B 31/02; C30B 25/02; C30B 15/00; C30B 29/06
  See application file for complete search history.

(56) References Cited

U.S. PATENT DOCUMENTS

| | | | |
|---|---|---|---|
| 2009/0218661 A1 | 9/2009 | Kurita et al. | |
| 2009/0224367 A1* | 9/2009 | Kurita | ............. C30B 15/00 257/607 |

| | | | |
|---|---|---|---|
| 2010/0148297 A1 | 6/2010 | Kurita | |
| 2011/0300371 A1 | 12/2011 | Omote et al. | |
| 2014/0374861 A1 | 12/2014 | Hoshi et al. | |

FOREIGN PATENT DOCUMENTS

| | | |
|---|---|---|
| JP | 2001-284568 A | 10/2001 |
| JP | 2009-206431 A | 9/2009 |
| JP | 2009-283726 A | 12/2009 |
| JP | 2010-087327 A | 4/2010 |
| JP | 2012-138576 A | 7/2012 |
| TW | 479360 B | 3/2002 |
| WO | 2013/057887 A1 | 4/2013 |

OTHER PUBLICATIONS

Jun. 7, 2016 Notification of Reasons for Refusal issued in Japanese Patent Application No. 2013-100180.
Jul. 1, 2014 Search Report issued in International Patent Application No. PCT/JP2014/001819.
Oct. 20, 2016 Office Action issued in Taiwanese Patent Application No. 10521280580.
Jul. 4, 2016 Office Action issued in Taiwanese Patent Application No. 103112728.
Nov. 10, 2015 International Preliminary Report on Patentability issued in International Patent Application No. PCT/JP2014/001819.
Feb. 27, 2019 Office Action issued in Korean Application No. 10-2015-7031806.

* cited by examiner

SILICON EPITAXIAL WAFER AND METHOD OF PRODUCING SILICON EPITAXIAL WAFER

TECHNICAL FIELD

The present invention relates to an epitaxial wafer made of a silicon single crystal substrate (also referred to as a silicon substrate below) doped with carbon that is used as a semiconductor device substrate such as a memory, logic, and a solid-state image sensor and to a method of producing a silicon epitaxial wafer.

BACKGROUND ART

Silicon substrates used as semiconductor device substrates such as memories, logics, and solid-state image sensors are cut from silicon single crystal ingots produced by the Czochralski (CZ) method or other methods. There is an increasing need for various wafers produced depending on use: polished wafers obtained from silicon substrates subjected to mirror polishing; annealed wafers obtained from the polished wafers subjected to an annealing process to suppress defects in their surface layer or to form an intrinsic gettering (IG) layer in their bulk; epitaxial wafers each having a formed epitaxial layer; and SOI wafers. Silicon substrates containing oxygen atoms are used in an attempt to increase IG capability so that higher performance devices with higher reliability are obtained.

It is known that these oxygen atoms contained in the silicon substrates are combined with silicon atoms by a heat treatment process to form oxide precipitates and bulk micro defects (BMDs), which capture contaminant atoms such as heavy metal atoms in the interior of the wafers, thereby improving device characteristics.

In recent years, sufficient IG capability is given by control of single crystal so as to take in oxygen at a high concentration or production involving intentional doping of carbon or nitrogen, while crystal defects in the silicon substrate is regulated. In particular, a solid-state image sensor uses an epitaxial wafer obtained by forming an epitaxial layer on a silicon substrate cut from a silicon single crystal ingot produced in this way.

This epitaxial wafer has a rational structure that can separate the epitaxial layer, which is a region at which a device is to be formed, from the silicon substrate. Making use of this feature, there are many suggestions to give sufficient IG capability to the silicon substrate, which is not the region at which a device is to be formed.

One of these recently used is to produce a silicon substrate by growing a silicon single crystal ingot doped with elements such as nitrogen or carbon by the CZ method and slicing this ingot. This enables the silicon substrate to precipitate oxygen remarkably in its bulk and form BMD at a high density in a device process. Such a substrate has a wider range of uses because of an advantage in its excellent IG capability.

An epitaxial wafer as shown in FIG. 3 is also used for a device. FIG. 3 is a schematic diagram of a conventional silicon epitaxial wafer. This wafer has an intermediate epitaxial layer 20 doped with p-type or n-type elements (a dopant) between a silicon substrate 10 doped with carbon and an epitaxial layer 30 of the region at which a device is to be formed.

In exemplary production of this silicon epitaxial wafer, if the intermediate epitaxial layer 20 of n+(P) is grown on the silicon substrate 10, a dopant is added by a gas dopant such that a dopant concentration is the order of $1\times10^{16}$ to $1\times10^{17}$ atoms/cm$^3$ to grow the intermediate epitaxial layer 20.

The epitaxial layer 30 of the device forming region is grown after the formation of the intermediate epitaxial layer 20. In an exemplary case of growing the epitaxial layer 30 of the device forming region of n$^-$ (P), a dopant is added by a gas dopant such that a dopant concentration is the order of $1\times10^{13}$ to $1\times10^{15}$ atoms/cm$^3$ to grow the epitaxial layer 30 of the device forming region.

In this manner, these processes of epitaxial growth enable acquisition of a silicon epitaxial wafer having a two-layer structure of epitaxial layers that can be expressed by n$^-$ (substrate)/n$^+$/n$^-$. This epitaxial wafer having a two-layer structure have various uses. The epitaxial layer 30 is not only the device forming region but also a region at which a well is formed. As shown in FIG. 4, for example, p-type impurities may be implanted selectively into the epitaxial layer 30 (n$^-$) of the device forming region to form a p-type conductive layer 30p after the n$^-$ (substrate)/n+/n$^-$ silicon epitaxial wafer has been obtained. In this case, there is a p/n boundary in a boundary region between the p-type conductive layer 30p and the intermediate epitaxial layer 20 (n$^+$).

The distance between a surface of a wafer and this p/n boundary is important in designing devices. As the shrinking of devices recently advances, an error of the order of micrometers or submicrometers of this distance becomes a potential factor in impeding electrical characteristics. For a solid-state image sensor, for example, such an error is an obstacle to transfer of part of an electric charge accumulated in a photodiode to the epitaxial layer 30 (n$^-$) of the device forming region. The position of the p/n boundary between the epitaxial layer 30 (n$^-$) of the device forming region and the p-type conductive layer 30p is accordingly important. Nonuniform distance between the p/n boundary and the wafer surface can cause an uneven image of the solid-state image sensor.

The position of the p/n boundary is determined by a distance at which elements in the intermediate epitaxial layer (n-type elements, here) are diffused by a thermal process in a device process. Thus, this diffusion distance of elements in the intermediate epitaxial layer 20 (n-type elements, here) subjected to the thermal process is also a control factor that has considerable influence.

For example, Patent Document 1 discloses definition of the thickness of a device forming region formed on a silicon substrate produced from a CZ silicon single crystal ingot doped with carbon.

In recent years, however, the device forming region is required to have a decreased thickness while the shrinking of devices advances as described above. There is a need to suggest a wafer that does not impede device characteristics even when the thickness of its device forming region is thin, especially in order to make the best use of the advantage of the CZ silicon substrate doped with carbon having excellent IG capability.

CITATION LIST

Patent Literature

Patent Document 1: Japanese Unexamined Patent publication (Kokai) No. 2009-206431

SUMMARY OF INVENTION

Technical Problem

The present inventor found that when a silicon substrate doped with carbon is used, the amount of carbon dopant varies the diffusion distance of an intermediate epitaxial layer subjected to a thermal process. The larger the amount of carbon dopant of the silicon substrate, the longer the diffusion distance of the elements in the intermediate epitaxial layer; the smaller the amount of carbon dopant, the shorter the diffusion distance of the elements in the intermediate epitaxial layer. The inventor also found that the diffusion of the carbon in the silicon substrate occurs at the same time as the elements in the intermediate epitaxial layer are diffused, and greatly affects the diffusion distance of the elements in the intermediate epitaxial layer.

The present invention was accomplished in view of the above-described problems. It is an object of the present invention to provide an industrially excellent silicon epitaxial wafer produced with a silicon substrate doped with carbon, and a method of producing the silicon epitaxial wafer. This silicon epitaxial wafer is used as a semiconductor device substrate such as a memory, a logic, or a solid-state image sensor.

Solution to Problem

To achieve this object, the present invention provides a silicon epitaxial wafer comprising: a silicon substrate doped with carbon, the silicon substrate being produced by being cut from a silicon single crystal ingot grown by a Czochralski method so as to have a carbon concentration ranging from $3\times10^{16}$ to $2\times10^{17}$ atoms/cm$^3$; a first intermediate epitaxial layer that is doped with a dopant and disposed on the silicon substrate; an epitaxial layer stacked on the first intermediate epitaxial layer, the epitaxial layer being a region at which a device is to be formed; and a second intermediate epitaxial layer disposed between the silicon substrate and the first intermediate epitaxial layer.

The present invention also provides a method of producing a silicon epitaxial wafer, comprising:

preparing a silicon substrate that is doped with carbon and produced by cutting a silicon single crystal ingot grown by a Czochralski method so as to have a carbon concentration ranging from $3\times10^{16}$ to $2\times10^{17}$ atoms/cm$^3$; forming a first intermediate epitaxial layer doped with a dopant over the silicon substrate; stacking an epitaxial layer on the first intermediate epitaxial layer, the epitaxial layer being a region at which a device is to be formed; and forming a second intermediate epitaxial layer on the silicon substrate before forming the first intermediate epitaxial layer.

Such a method and such a silicon epitaxial wafer, in which the second intermediate epitaxial layer, the first intermediate epitaxial layer, and the epitaxial layer of the device forming region are stacked in this order on the silicon substrate produced by being cut from the silicon single crystal ingot grown by the CZ method so as to have a carbon concentration ranging from $3\times10^{16}$ to $2\times10^{17}$ atoms/cm$^3$, enable the following: because the carbon concentration can be reduced during the formation of the second intermediate epitaxial layer, the carbon concentration can be sufficiently reduced at the boundary between the first intermediate epitaxial layer and the epitaxial layer of the device forming region; this enables the carbon concentration to be reduced to such an extent that the variation in position of the p/n boundary in the epitaxial layer of the device forming region does not occur even when the carbon is diffused in a device process.

In the invention, the second intermediate epitaxial layer preferably has a thickness ranging from 0.5 μm to 2 μm. The inventive producing method preferably forms the second intermediate epitaxial layer so as to have a thickness ranging from 0.5 μm to 2 μm.

The second intermediate epitaxial layer having a thickness ranging from 0.5 μm to 2 μm allows strong inhibition of the carbon diffusion to the interior of the epitaxial layer of the device forming region, thereby enabling the formation of the p/n boundary at a proper position nearly as designed, after the diffusion of the first intermediate epitaxial layer.

Moreover, in the invention, the thickness of the second intermediate epitaxial layer is preferably adjusted depending on an amount of the carbon with which the silicon substrate is doped. The inventive producing method preferably adjusts the thickness of the second intermediate epitaxial layer depending on an amount of the carbon with which the silicon substrate is doped.

Adjusting the thickness of the second intermediate epitaxial layer depending on the amount of the carbon dopant in the silicon substrate can inhibit the variation in position of the p/n boundary and reduce the production cost, for example, by adjusting the thickness of the second intermediate epitaxial layer to be decreased if the carbon concentration of the silicon substrate is low.

In the invention, the thickness of the second intermediate epitaxial layer is also preferably adjusted depending on a position at which the silicon substrate is cut from the silicon single crystal ingot. The inventive producing method preferably adjusts the thickness of the second intermediate epitaxial layer depending on a position at which the silicon substrate is cut from the silicon single crystal ingot.

The carbon concentration differs between a cone side and a tail side, that is, varies according to positions of the growth direction of the single crystal ingot due to segregation of carbon during growth of the CZ silicon single crystal ingot. The present invention accordingly adjusts the thickness of the second intermediate epitaxial layer depending on a position at which the silicon substrate is cut from the silicon single crystal ingot. In this way, the thickness of the second intermediate epitaxial layer can more readily be adjusted. This adjustment more reliably enables the inhibition of the variation in position of the p/n boundary and reduction in production cost.

Advantageous Effects of Invention

The present invention enables the carbon concentration to be reduced to such an extent that the variation in position of the p/n boundary in the epitaxial layer of the device forming region does not occur even when the carbon is diffused in a device process because of use of a silicon substrate doped with carbon, as described above. The invention can thereby provide an industrially excellent silicon epitaxial wafer that is produced with a silicon substrate doped with carbon and can be used as a semiconductor device substrate such as a memory, a logic, or a solid-state image sensor, and a method of producing this silicon epitaxial wafer.

DESCRIPTION OF EMBODIMENTS

The present inventor found that when a silicon substrate doped with carbon is used, the amount of carbon dopant varies the diffusion distance of an intermediate epitaxial layer subjected to a thermal process, as described previously. The inventor also found that the diffusion of the carbon in the silicon substrate occurs at the same time as the elements in the intermediate epitaxial layer are diffused, and greatly affects the diffusion distance of the elements in the intermediate epitaxial layer.

In view of these, the inventor discovered the following and thereby brought the invention to completion. An additional intermediate epitaxial layer (a second intermediate epitaxial layer) is formed between the intermediate epitaxial layer and the silicon substrate so that the concentration of the carbon distributed by the diffusion of carbon in the silicon substrate is adjusted; a first intermediate epitaxial layer is then formed on the second intermediate epitaxial layer; in this case, the position of the p/n boundary of an epitaxial layer, which is a device forming region, does not change even when a high temperature heat treatment is performed.

An embodiment of the present invention will hereinafter be described in more detail with reference to the drawings, but the present invention is not limited to this embodiment.

The inventive silicon epitaxial wafer and a method of producing this wafer will be first described below with reference to FIG. 1 and FIG. 2.

Figure 1:
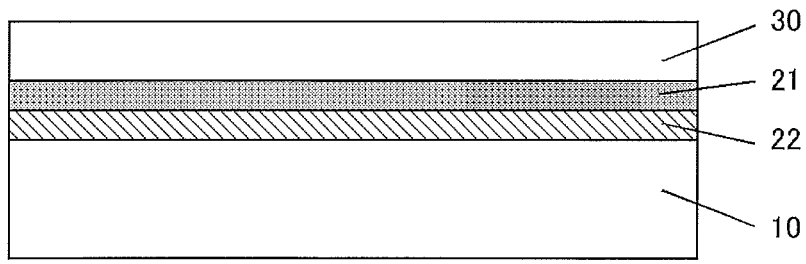
FIG. 1 is a schematic diagram of a silicon epitaxial wafer according to the present invention.
Figure 2:
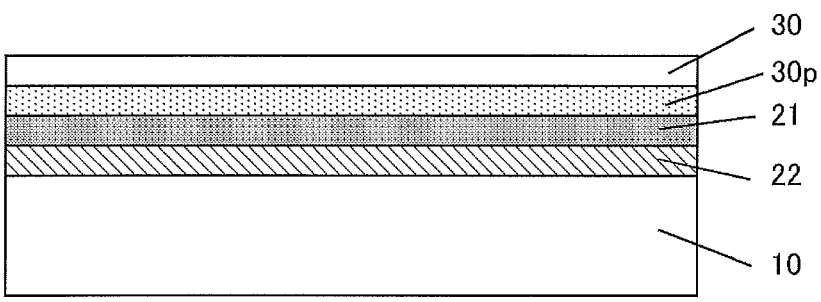
FIG. 2 is a schematic diagram of an example of the inventive silicon epitaxial wafer in which a p-type conductive layer is formed.
Figure 3:
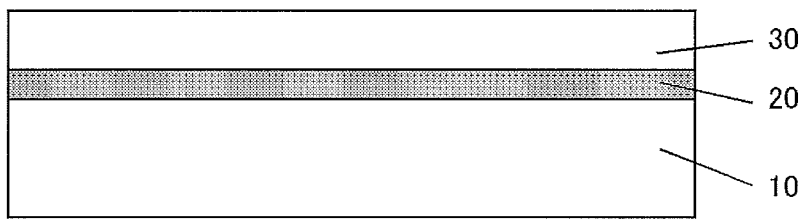
FIG. 3 is a schematic diagram of a conventional silicon epitaxial wafer.
Figure 4:
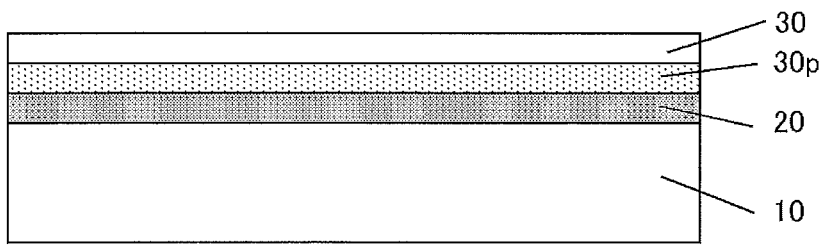
FIG. 4 is a schematic diagram of a conventional silicon epitaxial wafer in which a p-type conductive layer is formed.

In the inventive silicon epitaxial wafer, the second intermediate epitaxial layer 22, the first intermediate epitaxial layer 21, and the epitaxial layer 30 of the device forming region are stacked on a silicon substrate 10 produced by being cut from a silicon single crystal ingot grown by the CZ method so as to have a carbon concentration ranging from $3 \times 10^{16}$ to $2 \times 10^{17}$ atoms/cm$^3$ (FIG. 1). FIG. 2 shows a silicon epitaxial wafer in which a p-type conductive layer 30p is formed in the epitaxial layer 30 of the device forming region.

When the silicon epitaxial wafer configured as shown in FIG. 1 is produced, the silicon substrate 10 is first prepared by slicing a silicon single crystal ingot. This silicon single crystal ingot is grown by the Czochralski method (CZ) method so as to have a carbon concentration ranging from $3 \times 10^{16}$ to $2 \times 10^{17}$ atoms/cm$^3$ with an apparatus for pulling a silicon single crystal ingot as shown in FIG. 5.

Figure 5:
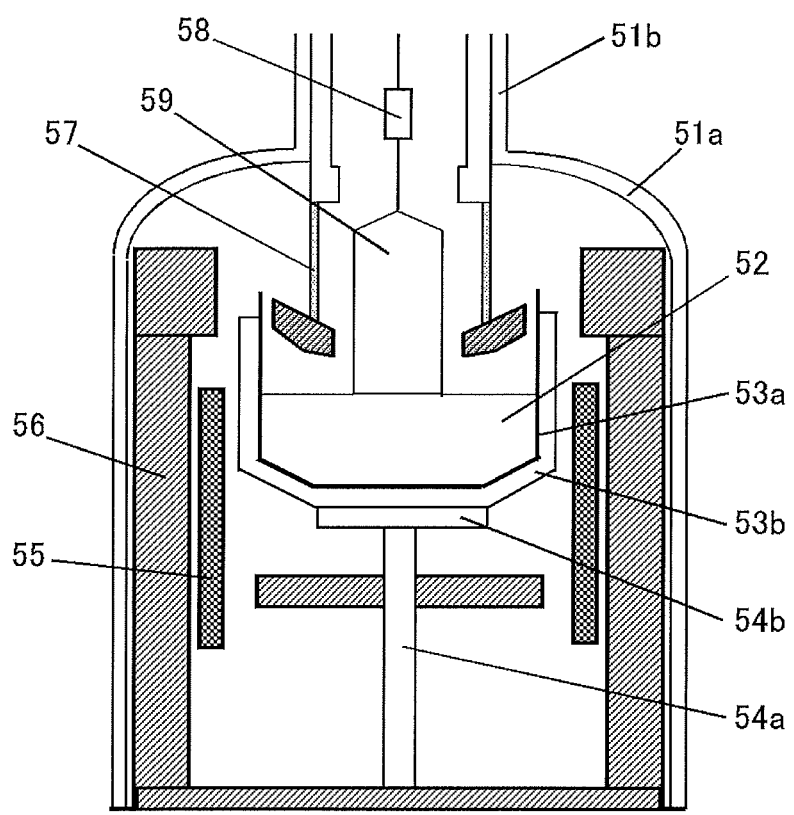
FIG. 5 is a schematic diagram of an apparatus for pulling a silicon single crystal ingot.

As shown in FIG. 5, the apparatus 50 for pulling a silicon single crystal ingot includes a main chamber 51a and a pull chamber 51b. In the interior of the main chamber 51a, a quartz crucible 53a configured to contain a raw material melt 52 and a graphite crucible 53b supporting the quartz crucible 53a are provided. Those crucibles are supported by a receiver 54b disposed on a supporting shaft 54a, which is called a pedestal. A main heater 55 is disposed outside the crucibles. A heat insulating material 56 is disposed outside this heater along an inner wall of the main chamber 51a. A cylindrical gas-flow guiding cylinder 57 made of graphite with a heat insulating plate provided at its lower end is disposed above the crucibles.

The following description gives an instance of a method of obtaining a silicon single crystal ingot 59 doped with carbon by using the silicon-single-crystal-ingot pulling apparatus 50 shown in FIG. 5.

Polycrystalline silicon with high purity is first introduced into the quartz crucible 53a. If the target conductivity type is n-type, then a dopant of, for example, phosphorus (P) is added.

The conditions of the CZ method may be changed according to use: a magnetic field is applied or no magnetic field is applied. In addition, the elements determining the conductivity type and resistivity of the silicon substrate can be changed according to use. The elements such as phosphorus (P), boron (B), arsenic, antimony, gallium, germanium or aluminum can be added.

After the raw material is charged into the quartz crucible 53a, an argon gas is introduced from a gas inlet provided in the pull chamber 51b while a vacuum pump is operated to ventilate the interior through a gas outlet so that the interior is displaced by an argon atmosphere.

The main heater 55 disposed so as to surround the graphite crucible 53b then heats and melts the raw material contained in the quartz crucible 53a, thereby forming the raw material melt 52. After the raw material is melted, a seed crystal 58 is dipped into the raw material melt 52 and pulled up while being rotated so that the silicon single crystal ingot 59 is grown.

The method of doping carbon of an additive raw material may be properly selected from the following methods: doping carbon by a gas during the pull of the silicon single crystal ingot 59; using a container made of polycrystalline silicon containing high purity carbon powder, a lump of carbon, or carbon powder; introducing polycrystalline silicon containing carbon in a prescribed amount into the crucible.

The silicon single crystal ingot 59 thus obtained becomes a silicon substrate (sub.) through wafer processing operations. These processing operations for the silicon substrate are performed in accordance with conventional operations. Cutting with a cutting apparatus (not shown) such as an inner diameter slicer or a wire saw is followed by surface treatments such as polishing and cleaning on the obtained silicon substrate. Besides these processes, there are various processes such as chamfering and lapping. An annealing process may be performed according to use. The flatness of a mirror-polished wafer obtained by the above process is an important quality for production of an epitaxial wafer. The order and conditions of these processes are changed properly to achieve desired flatness.

For a phosphorus (P) doped n-type, for example, the silicon substrate thus obtained usually contains phosphorus added so as to have a concentration of the order of $1\times10^{14}$ to $1\times10^{15}$ atoms/cm$^3$ and carbon added so as to have a concentration of $3\times10^{16}$ to $2\times10^{17}$ atoms/cm$^3$. The carbon contained in the silicon substrate makes oxide precipitates easy to appear at a high density in a device process, thereby providing sufficient gettering capability. The amount of carbon to be added may be changed properly according to the conditions of a thermal process of a device process.

In the above manner, the silicon substrate can be prepared, which is produced by cutting the silicon single crystal ingot grown by the CZ method so as to have a carbon concentration ranging from $3\times10^{16}$ to $2\times10^{17}$ atoms/cm$^3$.

After the wafer processing operations of the silicon substrate 10, the second intermediate epitaxial layer 22 is formed on the silicon substrate 10.

The reason why the second intermediate epitaxial layer 22 (n$^-$) is formed in the invention is as follows.

The position of the p/n boundary (a boundary region between a p-type conductive layer and an intermediate epitaxial layer (n$^+$)) depends on the ability of this intermediate epitaxial layer (n$^+$) to diffuse by a thermal process. In order to prevent the occurrence of variation in position of the p/n boundary, the distance of the diffusion of the intermediate epitaxial layer (n$^+$) needs to be uniform in a chip.

If the silicon substrate contains carbon, the distance of the diffusion of the intermediate epitaxial layer (n$^+$) may be affected by carbon diffusion from the silicon substrate. This is a factor in the nonuniform distance of the diffusion of the intermediate epitaxial layer (n$^+$). This carbon diffusion changes the ability of the intermediate epitaxial layer (n$^+$) to diffuse. The degree of this change greatly depends on the carbon concentration of the silicon substrate. The higher the carbon concentration of the silicon substrate, the longer the distance of the diffusion of the intermediate epitaxial layer (n$^+$); the lower this carbon concentration, the shorter the distance of the diffusion of the intermediate epitaxial layer (n$^+$).

The position of the p/n boundary greatly varies in a narrow area within a chip size, particularly when the carbon concentration of the silicon substrate is nonuniformly distributed in its plane.

The carbon concentration at the interface between the silicon substrate and the intermediate epitaxial layer (n$^+$) is notable for prevention of the variations in position of the p/n boundary. A decrease in the carbon concentration at the p/n interface after the growth of the epitaxial layer enables a decrease in the concentration of carbon diffusion into the epitaxial layer of the device forming region, thereby preventing the variation in position of the p/n boundary during a thermal process in a device process after the growth of the epitaxial layer.

The present invention accordingly grows the second intermediate epitaxial layer 22 on the silicon substrate 10 in a furnace for epitaxial growth by various CVD methods before the first intermediate epitaxial layer 21 is grown on the silicon substrate 10.

In this way, the concentration of carbon contained in the second intermediate epitaxial layer 22 is reduced during the epitaxial growth of the second intermediate epitaxial layer 22. The carbon concentration at a boundary region between the second intermediate epitaxial layer 22 and the first intermediate epitaxial layer 21 is thereby reduced by an amount corresponding to one layer compared with the carbon concentration at a boundary region between the silicon substrate 10 and the second intermediate epitaxial layer 22. This makes the concentration of the carbon diffusion low to such an extent that the variation in position of the p/n boundary in the epitaxial layer 30 of the device forming region does not occur even when the carbon is diffused from a silicon substrate side to a wafer surface side by a thermal process in a device process.

According to investigation of the behavior of diffusing carbon, the carbon is easier to diffuse to a silicon substrate bulk side than to the wafer surface side from a starting point of the surface of the silicon substrate 10. Since the degree of the diffusion to the wafer surface side, on the contrary, is smaller, the thickness of the second intermediate epitaxial layer 22 may be thin.

This thickness of the second intermediate epitaxial layer 22 to be formed is preferably within a range of $0.5~\mu m \leq t \leq 2~\mu m$, where t is the thickness of the second intermediate epitaxial layer 22.

Since the carbon in the silicon substrate diffuses to the silicon substrate bulk side more extensively than to the wafer surface side, the second intermediate epitaxial layer 22 is sufficiently effective even when its thickness is 2 μm or less.

In this case, the carbon concentration of the silicon substrate 10 is limited within the range from $3\times10^{16}$ to $2\times10^{17}$ atoms/cm$^3$. If the carbon concentration of the silicon substrate 10 is $3\times10^{16}$ atoms/cm$^3$ or more, the position of the p/n boundary in the epitaxial layer 30 of the device forming region varies. The formation of the second intermediate epitaxial layer 22 is therefore essential to the prevention of this problem. If the carbon concentration of the silicon substrate 10 is $2\times10^{17}$ atoms/cm$^3$ or less, no large precipitates appear, and the electrical characteristics of a fabricated device is not adversely affected.

The thickness of the second intermediate epitaxial layer 22 is preferably adjusted depending on the magnitude of the concentration of carbon dopant in the silicon substrate 10. This adjustment allows for the economy such as production cost of the epitaxial growth. If the carbon concentration of the silicon substrate 10 is low, for example, then the growth of the second intermediate epitaxial layer 22 can be adjusted such that its thickness becomes thin.

When the thickness of the second intermediate epitaxial layer 22 is determined, it is also preferable to adjust the thickness depending on a position at which the silicon substrate 10 is cut from the silicon single crystal ingot 59.

The segregation of the carbon varies its amount taken in the silicon single crystal ingot 59 pulled while being doped with carbon. Thus, the carbon concentration of the silicon single crystal ingot 59 on its cone side in the growth direction usually becomes smallest; the carbon concentration on its tail side becomes largest. The adjustment can accordingly be made as follows: for a silicon substrate cut from the first half portion of the cone side in the single crystal growth direction, the second intermediate epitaxial layer 22 is grown with a thin thickness; for a silicon substrate cut from the second half of the tail side, the second intermediate epitaxial layer 22 is grown with a thickness thicker than the thickness of the second intermediate epitaxial layer 22 of the silicon substrate cut from the first half portion.

This adjustment enables the formation of the second intermediate epitaxial layer 22 with a proper thickness even when the carbon concentration of the first half portion of the cone side of the silicon single crystal ingot is less than the detection limit.

The first intermediate epitaxial layer 21 is then formed on the second intermediate epitaxial layer 22. The epitaxial layer 30 of the device forming region is further stacked to obtain the inventive silicon epitaxial wafer (See FIG. 1). After that, as shown in FIG. 2, impurities such as p-type impurities to form the p-type conductive layer 30p may be implanted selectively into the epitaxial layer 30 of the device forming region, so that the p/n boundary can be formed at the boundary region between the p-type conductive layer 30p and the first intermediate epitaxial layer 21.

The above description is summarized as follows. The inventor found the carbon concentration of an epitaxial layer, which is a region at which a device is to be formed, is determined by the carbon concentration of an intermediate epitaxial layer. The invention accordingly forms a second intermediate epitaxial layer before forming a first intermediate epitaxial layer, and thereby can restrain the carbon concentration of a boundary region between the first and second intermediate epitaxial layers when the first intermediate epitaxial layer has been formed. This leads to a reduction in carbon concentration of the first intermediate epitaxial layer before a thermal process, thereby enabling the inhibition of carbon diffusion into a device region in an epitaxial layer during the thermal process such that a p/n boundary is prevented from moving out of position.

The invention can therefore provide an industrially excellent silicon epitaxial wafer produced with a silicon substrate doped with carbon, and a method of producing the silicon epitaxial wafer. This silicon epitaxial wafer can be used as a semiconductor device substrate such as a memory, a logic, or a solid-state image sensor.

Example

The present invention will be more specifically described below with reference to an example, but the present invention is not limited to this example.

Example

A silicon substrate 10 doped with carbon was first prepared.

A phosphorus dopant for adjusting resistivity and 360 kg of silicon polycrystalline raw material were charged into a quartz crucible 53a having a diameter of 32 inches (800 mm) disposed in a main chamber 51a of a silicon single crystal ingot pulling apparatus 50 as shown in FIG. 5, and heated with a heater 55 to obtain a raw material melt 52.

An n-type silicon single crystal ingot 59 having a diameter of 300 mm and a straight body length of 140 cm was grown while a horizontal magnetic field with a central magnetic field strength of 4000 G was applied by the magnetic field applied Czochralski (MCZ) method. In this growth, the resistivity of n-type was controlled to be 10 Ωcm at the central portion of the straight body of the crystal. The amount of the carbon dopant was $5\times10^{16}$ atoms/cm$^3$ at the central portion of the crystal straight body. The n-type silicon single crystal ingot 59 was cut. A mirror polished wafer was produced through processing operations as the silicon substrate 10.

An n$^-$-type second intermediate epitaxial layer 22 was then formed on the silicon substrate 10 by epitaxial growth with a phosphorus dopant in a doping amount of $4.5\times10^{14}$ atoms/cm$^3$. An n$^+$-type first intermediate epitaxial layer 21 doped with phosphorus in an amount of $3\times10^{17}$ atoms/cm$^3$ was stacked on the second intermediate epitaxial layer 22, and then an epitaxial layer 30 of an n$^-$-type device forming region doped with phosphorus in an amount of $1.5\times10^{14}$ atoms/cm$^3$ was stacked thereon.

Figure 6A:
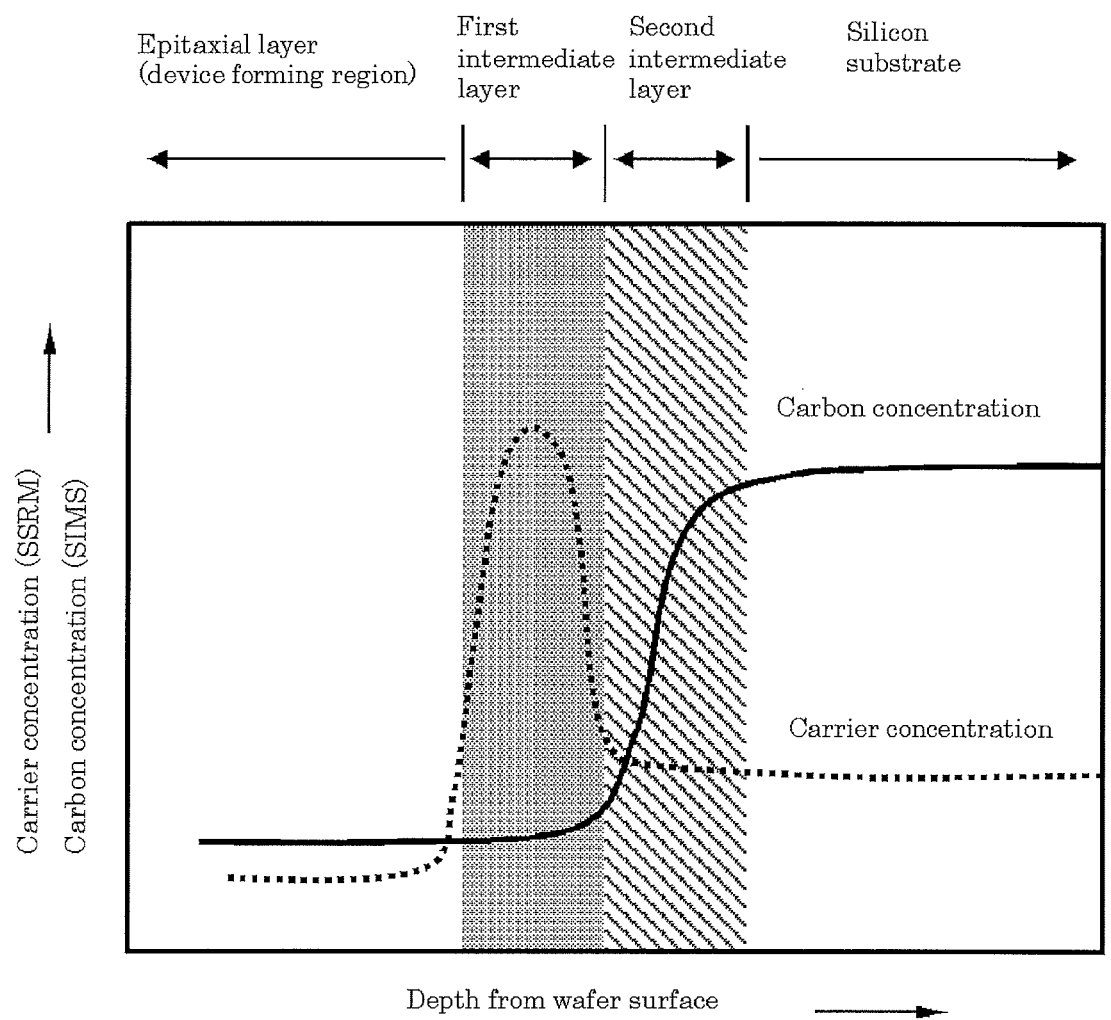
FIG. 6A is an explanatory view of the relation of a carrier concentration and a carbon concentration to the depth from a surface of a silicon epitaxial wafer before a heat treatment in Example.

Table 1 below shows the conditions of this epitaxial growth. The carrier concentration in cross section of the silicon epitaxial wafer at that time was measured by scanning spreading resistance microscopy (SSRM). The distribution of phosphorus diffusion and carbon diffusion in this cross section were evaluated by secondary ion mass spectrometry (SIMS). FIG. 6A shows the result of the relation between the carbon concentration and the carrier concentration with respect to the depth from the wafer surface.

TABLE 1

| Silicon substrate | | Second intermediate epitaxial layer | | First intermediate epitaxial layer | | Epitaxial layer (Device forming region) | |
| --- | --- | --- | --- | --- | --- | --- | --- |
| Conductivity | Target carbon concentration [atoms/cm$^3$] | Conductivity | Target thickness [μm] | Conductivity | Target thickness [μm] | Conductivity | Target thickness [μm] |
| n$^-$ | $5\times10^{16}$ | n$^-$ | 1.0 | n$^+$ | 1.5 | n$^-$ | 7.0 |

Figure 6B:
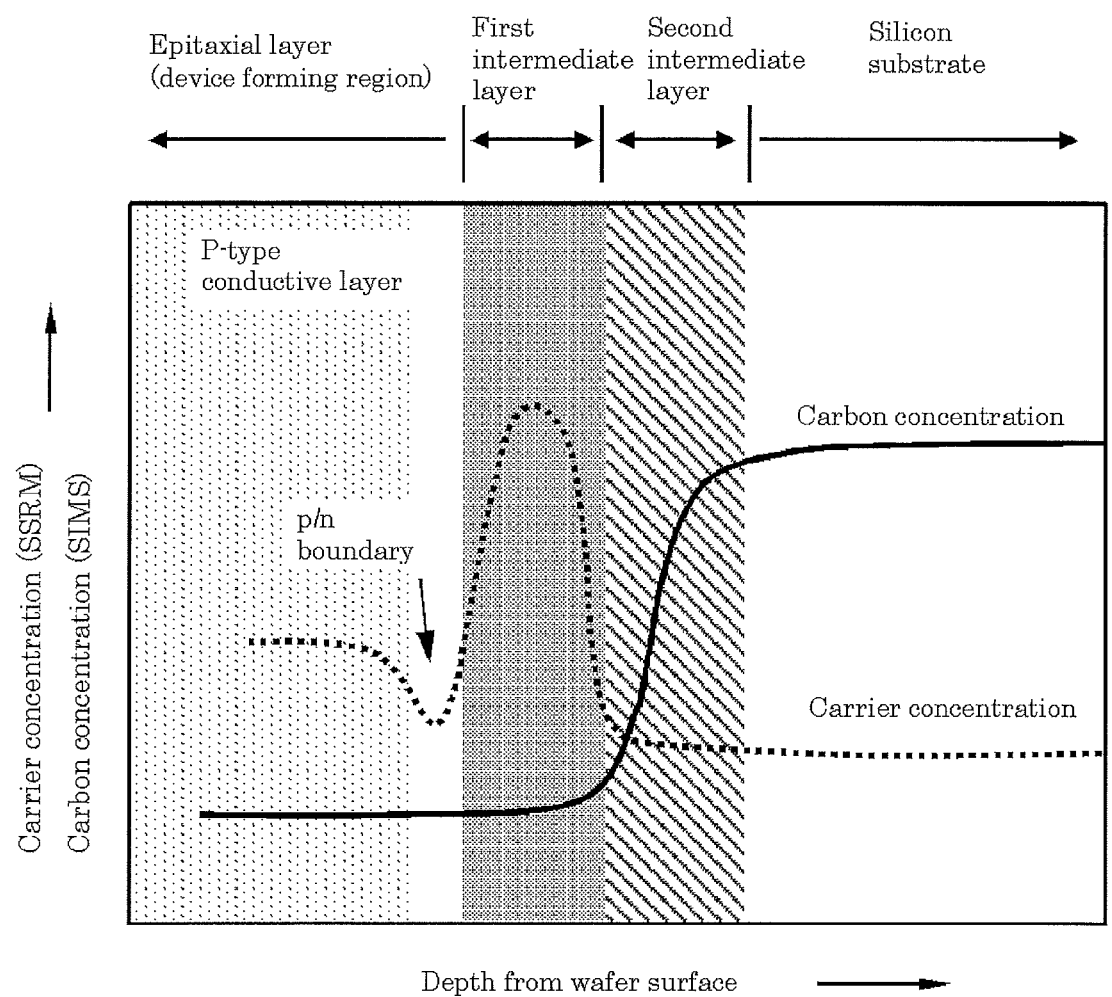
FIG. 6B is an explanatory view of the relation of a carrier concentration and a carbon concentration to the depth from a surface of a silicon epitaxial wafer just after a p-type conductive layer was implanted in Example.

Boron elements, p-type elements, were then implanted into the epitaxial layer 30 of the device forming region in an amount of $1\times10^{16}$ atoms/cm$^3$ to form a p-type conductive layer 30p. The carrier concentration in cross section of the silicon epitaxial wafer at that time was measured by SSRM. The p/n boundary was identified. The distribution of phosphorus diffusion and carbon diffusion in this cross section were evaluated by SIMS. FIG. 6B shows the result of the relation between the carbon concentration and the carrier concentration with respect to the depth from the wafer surface.

Then, heat treatments were performed in three stages (accelerated heat treatments). The detailed conditions of the three stage heat treatments are as follows.

(Conditions of Three Stage Heat Treatments)

First stage: 650° C., a nitrogen atmosphere, 20 minutes

Second stage: 800° C., four hours, dry oxidation

Third stage: 1000° C., 14 hours, cooling after dry oxidation

Figure 6C:
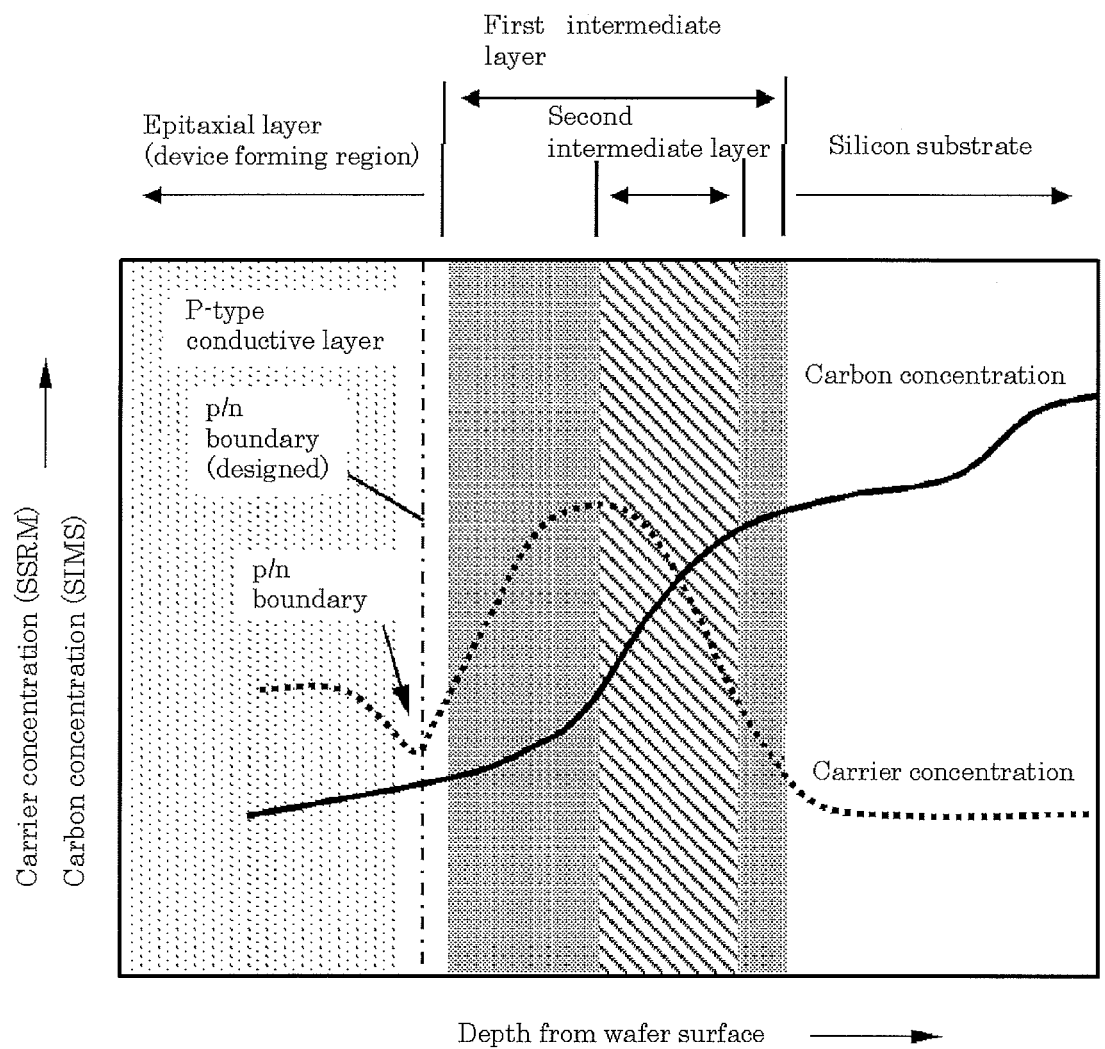
FIG. 6C is an explanatory view of the relation of a carrier concentration and a carbon concentration to the depth from a surface of a silicon epitaxial wafer after a heat treatment in Example.

The carrier concentration in cross section of the silicon epitaxial wafer after the three stage heat treatments was measured by SSRM. The p/n boundary was identified. The distribution of phosphorus diffusion and carbon diffusion in this cross section were evaluated by SIMS. FIG. 6C shows the result of the relation between the carbon concentration and the carrier concentration with respect to the depth from the wafer surface. As shown in FIG. 6C, the actual position of the p/n boundary moved about 0.1 μm from the designed position of the p/n boundary toward the wafer surface, where the designed position of the p/n boundary was converted to 0 μm. A solid-state image sensor was then fabricated to evaluate the unevenness of an image. Consequently, no uneven image was seen.

Comparative Example

A carbon-doped silicon substrate 10 having the same specifications as the above example was prepared in the same manner as the example.

An n$^+$-type first intermediate epitaxial layer 21 doped with phosphorus in an amount of $3\times10^{17}$ atoms/cm$^3$ was stacked on the silicon substrate 10, and then an epitaxial layer 30 of an n$^-$-type device forming region doped with phosphorus in an amount of $1.5\times10^{14}$ atoms/cm$^3$ was stacked thereon.

Figure 7A:
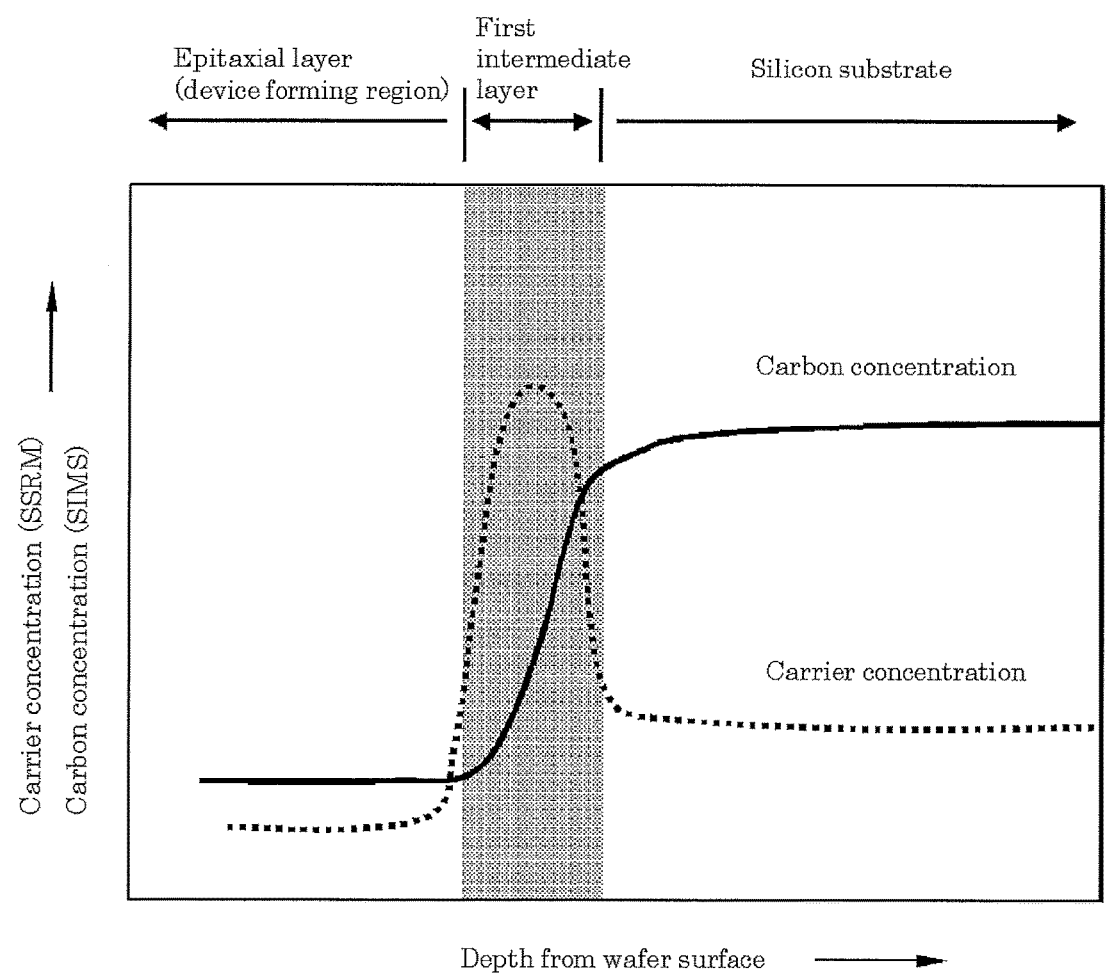
FIG. 7A is an explanatory view of the relation of a carrier concentration and a carbon concentration to the depth from a surface of a silicon epitaxial wafer before a heat treatment in Comparative Example.

Table 2 shows the conditions of this epitaxial growth. The carrier concentration and the distribution of carbon diffusion in cross section of the silicon epitaxial wafer at that time were evaluated. FIG. 7A shows the result of the relation between the carbon concentration and the carrier concentration with respect to the depth from the wafer surface.

TABLE 2

| Silicon substrate | | First intermediate epitaxial layer | | Epitaxial layer (Device forming region) | |
|---|---|---|---|---|---|
| Conductivity | Target carbon concentration [atoms/cm$^3$] | Conductivity | Target thickness [μm] | Conductivity | Target thickness [μm] |
| n$^-$ | $5 \times 10^{16}$ | n$^+$ | 1.5 | n$^-$ | 7.0 |

Figure 7B:
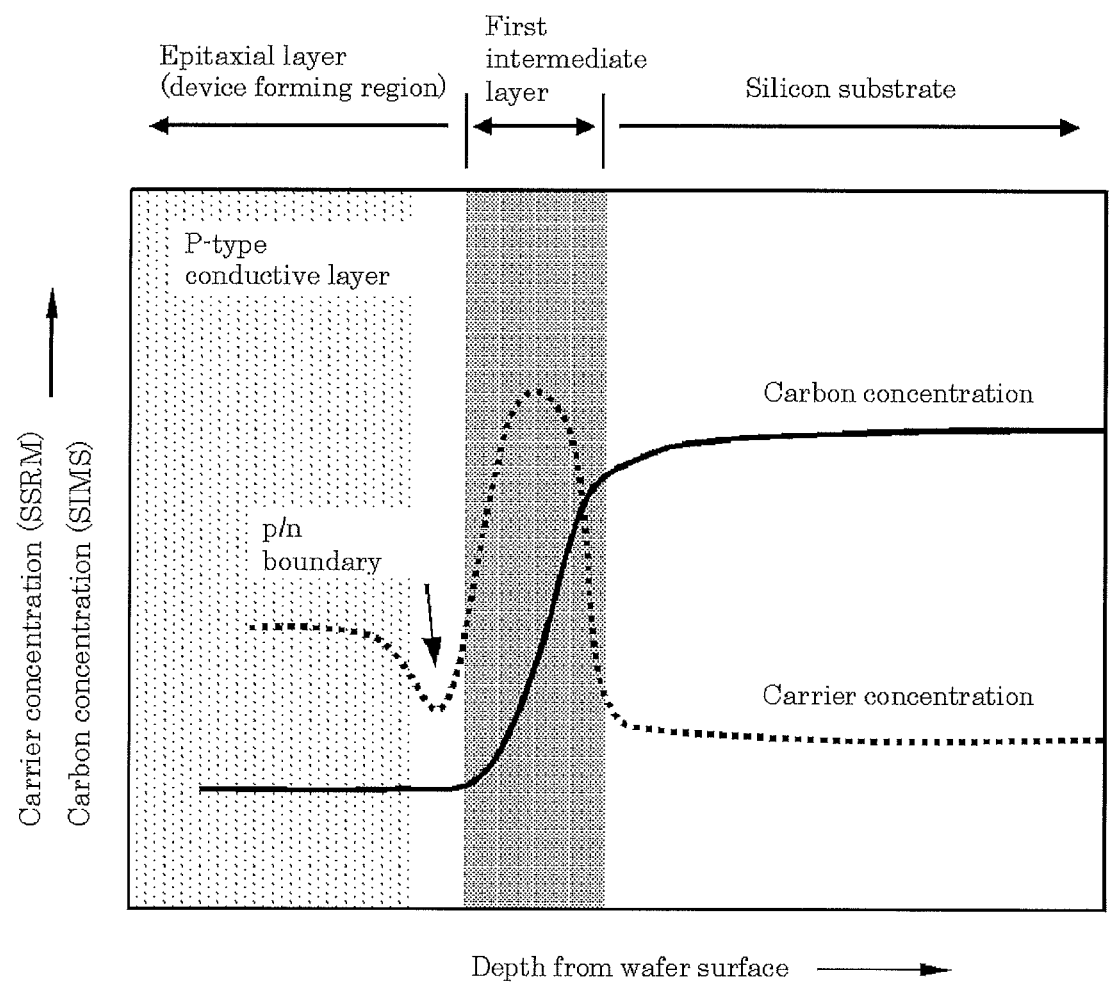
FIG. 7B is an explanatory view of the relation of a carrier concentration and a carbon concentration to the depth from a surface of a silicon epitaxial wafer just after a p-type conductive layer was implanted in Comparative Example.

A p-type conductive layer 30p was then formed in the epitaxial layer 30 of the device forming region as in the example. The carrier concentration in cross section of the silicon epitaxial wafer at that time was measured, and the p/n boundary was identified. The distribution of carbon diffusion was evaluated. FIG. 7B shows the result of the relation between the carbon concentration and the carrier concentration with respect to the depth from the wafer surface.

Then, heat treatments were performed in three stages (accelerated heat treatments) in the same manner as the example.

Figure 7C:
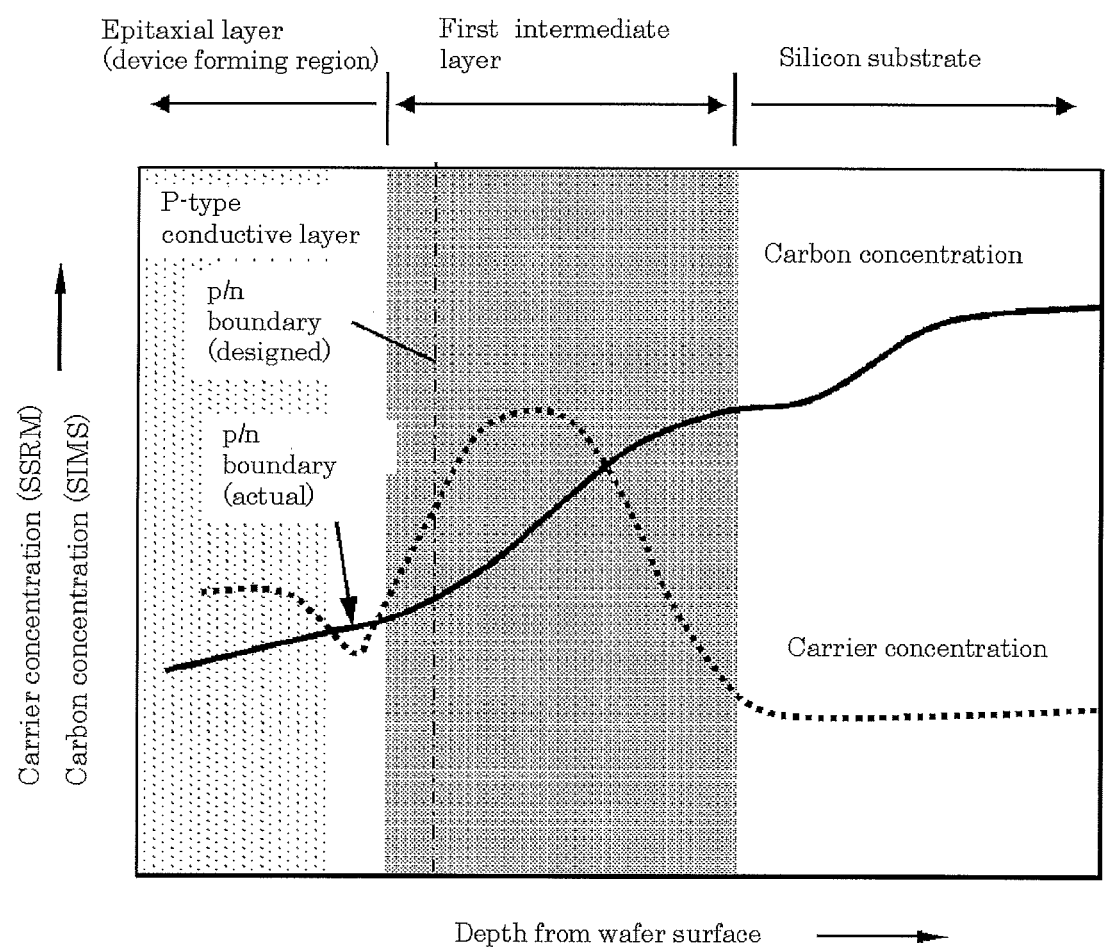
FIG. 7C is an explanatory view of the relation of a carrier concentration and a carbon concentration to the depth from a surface of a silicon epitaxial wafer after a heat treatment in Comparative Example.

The carrier concentration in cross section of the silicon epitaxial wafer after the three stage heat treatments was measured, and the p/n boundary was identified. The distribution of carbon diffusion was evaluated. FIG. 7C shows the result of the relation between the carbon concentration and the carrier concentration with respect to the depth from the wafer surface. As shown in FIG. 7C, the actual position of the p/n boundary moved 0.9 μm from the designed position of the p/n boundary toward the wafer surface, where the designed position of the p/n boundary was converted to 0 μm. A solid-state image sensor was then fabricated to evaluate the unevenness of an image. Consequently, a strongly uneven image was seen.

As seen from the results of the example and the comparative example, the present invention can produce a silicon epitaxial wafer that does not electrically impede device characteristics in operations of a semiconductor device, and stably provide a silicon epitaxial wafer that is greatly superior in electrical characteristics.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

For example, the present invention can be applied without being limited to the diameter, crystal orientation, conductivity, and resistivity of a silicon single crystal to be produced.

The invention claimed is:

1. A silicon epitaxial wafer comprising:
   a silicon substrate doped with carbon, the silicon substrate being produced by being cut from a silicon single crystal ingot grown by a Czochralski method so as to have a carbon concentration ranging from $3\times10^{16}$ to $2\times10^{17}$ atoms/cm$^3$;
   a first intermediate epitaxial layer that is doped with a dopant and disposed on the silicon substrate;
   an epitaxial layer stacked on the first intermediate epitaxial layer, the epitaxial layer being a region at which a device is to be formed; and
   a second intermediate epitaxial layer disposed between the silicon substrate and the first intermediate epitaxial layer, wherein
   the second intermediate epitaxial layer has a thickness ranging from 0.5 μm to 2 μm,
   the silicon substrate is an n-type silicon substrate,
   the second intermediate epitaxial layer is an n$^-$-type second intermediate epitaxial layer,
   the first intermediate epitaxial layer is an n$^+$-type first intermediate epitaxial layer,
   the epitaxial layer of the device forming region is an n$^-$-type epitaxial layer, and
   a p/n boundary is formed by ion implanting of p-type elements into the epitaxial layer of the device forming region.

2. The silicon epitaxial wafer according to claim 1, wherein a thickness of the second intermediate epitaxial layer is adjusted depending on an amount of the carbon with which the silicon substrate is doped, which thickness is decreased if the amount of carbon is too low or increased if the amount of carbon is too high.

3. The silicon epitaxial wafer according to claim 1, wherein a thickness of the second intermediate epitaxial layer is adjusted depending on a position at which the silicon substrate is cut from the silicon single crystal ingot, and,
   for a silicon substrate cut from the first half portion of the cone side in the single crystal growth direction, the second intermediate epitaxial layer has a first thickness, and
   for a silicon substrate cut from the second half portion of the tail side, the second intermediate epitaxial layer has a second thickness that is thicker than the first thickness.

4. A method of producing a silicon epitaxial wafer, comprising:
   preparing a silicon substrate that is doped with carbon and produced by cutting a silicon single crystal ingot grown by a Czochralski method so as to have a carbon concentration ranging from $3\times10^{16}$ to $2\times10^{17}$ atoms/cm$^3$;
   forming a first intermediate epitaxial layer doped with a dopant over the silicon substrate;
   stacking an epitaxial layer on the first intermediate epitaxial layer, the epitaxial layer being a region at which a device is to be formed; and
   forming a second intermediate epitaxial layer on the silicon substrate before forming the first intermediate epitaxial layer, wherein
   the second intermediate epitaxial layer is formed so as to have a thickness ranging from 0.5 μm to 2 μm,
   the silicon substrate is an n-type silicon substrate, the second intermediate epitaxial layer is an n⁻-type second intermediate epitaxial layer, the first intermediate epitaxial layer is an n⁺-type first intermediate epitaxial layer, the epitaxial layer of the device forming region is an n⁻-type epitaxial layer, and a p/n boundary is formed by ion implanting of p-type elements into the epitaxial layer of the device forming region.

5. The method according to claim 4, wherein a thickness of the second intermediate epitaxial layer is adjusted depending on an amount of the carbon with which the silicon substrate is doped, which thickness is decreased if the amount of carbon is too low or increased if the amount of carbon is too high.

6. The method according to claim 4, wherein a thickness of the second intermediate epitaxial layer is adjusted depending on a position at which the silicon substrate is cut from the silicon single crystal ingot, and, for a silicon substrate cut from the first half portion of the cone side in the single crystal growth direction, the second intermediate epitaxial layer has a first thickness, and for a silicon substrate cut from the second half portion of the tail side, the second intermediate epitaxial layer has a second thickness that is thicker than the first thickness.

* * * * *